United States Patent [19]

Maxwell et al.

[11] Patent Number: 5,427,051
[45] Date of Patent: Jun. 27, 1995

[54] SOLID STATE FORMATION OF SAPPHIRE USING A LOCALIZED ENERGY SOURCE

[75] Inventors: Randolph E. Maxwell, Chesterland; Curtis E. Scott, Mentor; Mary S. Kaliszewski, Cleveland Hts., all of Ohio; Marshall G. Jones, Scotia, N.Y.; Lionel M. Levinson, Schenectady, N.Y.; Carl E. Erikson, Schenectady, N.Y.

[73] Assignee: General Electric Company, Schenectady, N.Y.

[21] Appl. No.: 64,386

[22] Filed: May 21, 1993

[51] Int. Cl.[6] ............................................. C30B 13/22
[52] U.S. Cl. ............................................. 117/4; 117/3; 117/904
[58] Field of Search ...................... 156/603, 604, 616.1, 156/616.2, 620.7, 620.72, DIG. 80, DIG. 102, DIG. 103, DIG. 112; 219/121.85; 117/1, 3, 4, 49, 904, 905, 930

[56] References Cited

U.S. PATENT DOCUMENTS

| | | | |
|---|---|---|---|
| 988,230 | 3/1911 | Verneuil . | |
| 3,026,210 | 3/1962 | Coble | 106/39 |
| 3,382,047 | 5/1968 | Holtzberg et al. . | |
| 3,564,328 | 2/1971 | Bagley et al. | 313/624 |
| 3,591,348 | 7/1971 | Belle, Jr. | 117/23 |
| 3,943,324 | 3/1976 | Haggerty | 156/603 |
| 3,944,640 | 3/1976 | Haggerty et al. | 156/603 |
| 3,998,686 | 12/1976 | Meiling et al. | 117/33 |
| 4,058,699 | 11/1977 | van Vloten | 219/121 LM |
| 4,150,317 | 4/1979 | Laska et al. | 313/221 |
| 4,248,369 | 2/1981 | Chausen | 225/2 |
| 4,285,732 | 8/1981 | Charles et al. | 106/57 |
| 4,437,109 | 3/1984 | Anthony et al. | 357/68 |
| 4,444,615 | 4/1984 | Matsuzawa et al. | 117/6 |
| 4,519,870 | 5/1985 | Matsuzawa et al. | 117/7 |
| 4,900,393 | 2/1990 | Kugimiya et al. | 117/10 |
| 4,980,236 | 12/1990 | Oomen et al. | 428/469 |
| 5,200,370 | 4/1993 | Lennox et al. | 501/95 |

FOREIGN PATENT DOCUMENTS

| | | |
|---|---|---|
| 2522560 | of 0000 | Japan . |
| 62-21794 | 1/1987 | Japan . |
| 62-28118 | 6/1987 | Japan . |
| 62-278198 | 12/1987 | Japan . |

OTHER PUBLICATIONS

"Structural and Electron Diffraction Data for Sapphire ($\alpha Al_2O_3$)"; Lee et al; *J. of Electron Microsopy Technique;* pp. 247–258 (1985).

"Structure and Properties of MgO and $Al_2O_2$ Ceramics"; R. D. Bagley et al; in Advances in Ceramics, vol. 10; The American Ceramic Society, Inc. (1983/1984 proceedings).

*Primary Examiner*—R. Bruce Breneman
*Assistant Examiner*—Felisa Garrett
*Attorney, Agent, or Firm*—Edward M. Corcoran; Stanley C. Corwin

[57] ABSTRACT

Polycrystalline alumina bodies have been converted to sapphire by a solid state conversion process in which a localized energy source is used to heat only a portion of the body to a temperature above 1800° C. Using a laser as the energy source resulted in conversion to sapphire in less than an hour. The polycrystalline alumina bodies had a magnesia content below 50 wppm, an average grain size below 100 microns, and a density greater than 3.97 g/cc.

24 Claims, 4 Drawing Sheets

SOLID STATE FORMATION OF SAPPHIRE USING A LOCALIZED ENERGY SOURCE

BACKGROUND OF THE INVENTION

1. Field of the Invention

This invention relates to a solid state process for converting a polycrystalline alumina article to sapphire using a localized energy source, such as a laser, applied to only a portion of the article.

2. Background of the Disclosure

The manufacture of polycrystalline alumina (PCA), and its use for high pressure sodium arc discharge lamps (hereinafter "HPS lamps") is well known and old to those skilled in the art. U.S. Pat. Nos. 3,026,210; 4,150,317 and 4,285,732 to Coble, Laska et al and Charles et al, disclose the production of a high density PCA body having improved visible light transmission using relatively pure alumina powder and small amounts of magnesia. U.S. Pat. No. 4,285,732 further teaches adding zirconia and hafnia to the magnesia-doped alumina to reduce the chances of precipitating a spinel phase and exaggerated or run away grain growth during sintering. PCA bodies useful as arc tubes for HPS lamps have been made according to the processes in these patents having an average grain size ranging from between 15 microns to 100 microns.

Two major drawbacks associated with the use of PCA arc tubes for HPS lamps are that they are light translucent as opposed to light transparent and the sodium in the arc reacts with the alumina at the grain boundaries to form sodium aluminate, which shortens lamp life. HPS lamps are being designed for ever increasing internal sodium partial pressure within the PCA arc tube to improve the color rendition and provide a whiter emitted light. However, higher internal sodium pressure further shortens lamp life due to increased rate of sodium loss from the arc chamber. Progressive sodium loss results in a continual rise in the lamp operating voltage, decrease of both correlated color temperature and color rendering index, and a color shift from white to pink. Also, the sodium which migrates through the arc chamber wall deposits on the inside wall of the evacuated outer lamp envelope causing a brownish stain on the envelope which, in turn, further reduces the light output of the lamp. These problems are substantially reduced with sapphire (i.e., single crystal alumina) arc tubes.

Sapphire arc tubes useful as the arc chamber for HPS lamps have been made by a number of processes, including a modified Czochralski process known as the edge-defined, film-fed growth or (EFG) process developed by Tyco Laboratories, Inc. This process uses a seed crystal and a die on the surface of molten alumina where a hollow tube is continuously pulled out of the melt through the die. This process is expensive and slow. Another process used to produce single crystal alumina or sapphire is called the floating zone process in which a PCA feed rod is introduced at a predetermined velocity into a heating zone wherein one or more lasers or other concentrated heat source (5) is focused on the rod to melt the alumina in the zone to produce a "melt volume" of molten alumina. A sapphire fiber is continuously drawn from the melt volume at the desired velocity and the feed rod is moved simultaneously, but at a slower rate so that the process is a continuous one. This process is used primarily to produce sapphire fibers and does not readily lend itself to production of single crystal alumina tubing, although its use for such is disclosed in U.S. Pat. No. 3,943,324. Japanese Patent Publication 62-28118 discloses a furnace process for converting PCA tubes to sapphire tubes, but it is not known if this process was ever commercialized.

A need exists for producing sapphire from PCA in a facile and relatively inexpensive manner and preferably a solid state process for converting a polycrystalline ceramic article or body to a single crystal without substantial melting of the structure that is being converted, so that the single crystal has substantially the same size and shape as the polycrystalline article. A solid state conversion process would make it possible to manufacture single crystal article having non-uniform, asymmetric and complex shapes as well as simple shapes. It would also be a great improvement to the art if such a process were cost effective in greatly reducing both the energy and the time required to effect the formation of a single crystal ceramic structure from a polycrystalline ceramic structure.

SUMMARY OF THE INVENTION

The present invention relates to a solid state process for bulk conversion of a polycrystalline ceramic material to a single crystal ceramic material and particularly for converting polycrystalline alumina to single crystal alumina (hereinafter "sapphire") using a localized energy source applied to the article to be converted. By bulk conversion is meant a single crystal front propagating over macroscopic distances (e.g., >100 microns). By employing the solid state conversion process of the invention, pre-structured, simple or complex shapes of polycrystalline material can be fabricated and then converted to the corresponding single crystal without melting the entire article to be converted, thereby maintaining the original shape. In one embodiment of the invention, a dense polycrystalline alumina (PCA) article is converted to sapphire via a solid state conversion process which comprises employing a localized energy source applied to a portion of said PCA article and maintaining said energy source directed at said portion of said article for a time sufficient for the entire PCA article to convert to sapphire. A $CO_2$ laser energy source has been successfully employed as a localized energy source in the practice of this invention to convert PCA tubing to sapphire tubing by directing the laser beam at only one end of the hollow PCA tube which resulted in conversion of the entire tube to sapphire in less than an hour. The PCA tubes were fabricated from the GE Lucalox ® brand of PCA available from General Electric Company in Cleveland, Ohio. Prior to employing the laser to convert the PCA tubes to sapphire, the PCA tubes which contained magnesium oxide at a level of about 325 wppm, were heated in an electrical resistance furnace to reduce the amount of the magnesium oxide present.

Sapphire produced according to this invention is distinguished from natural sapphire and other synthetic sapphire by a combination of a completely random pore structure and a surface texture which exhibits itself as a topographical structure in the form of slight undulations having high points at approximately the midpoint of where each PCA grain was prior to the conversion and slight depressed areas corresponding to where the grain boundaries were prior to conversion.

DETAILED DESCRIPTION

Figure 1A:
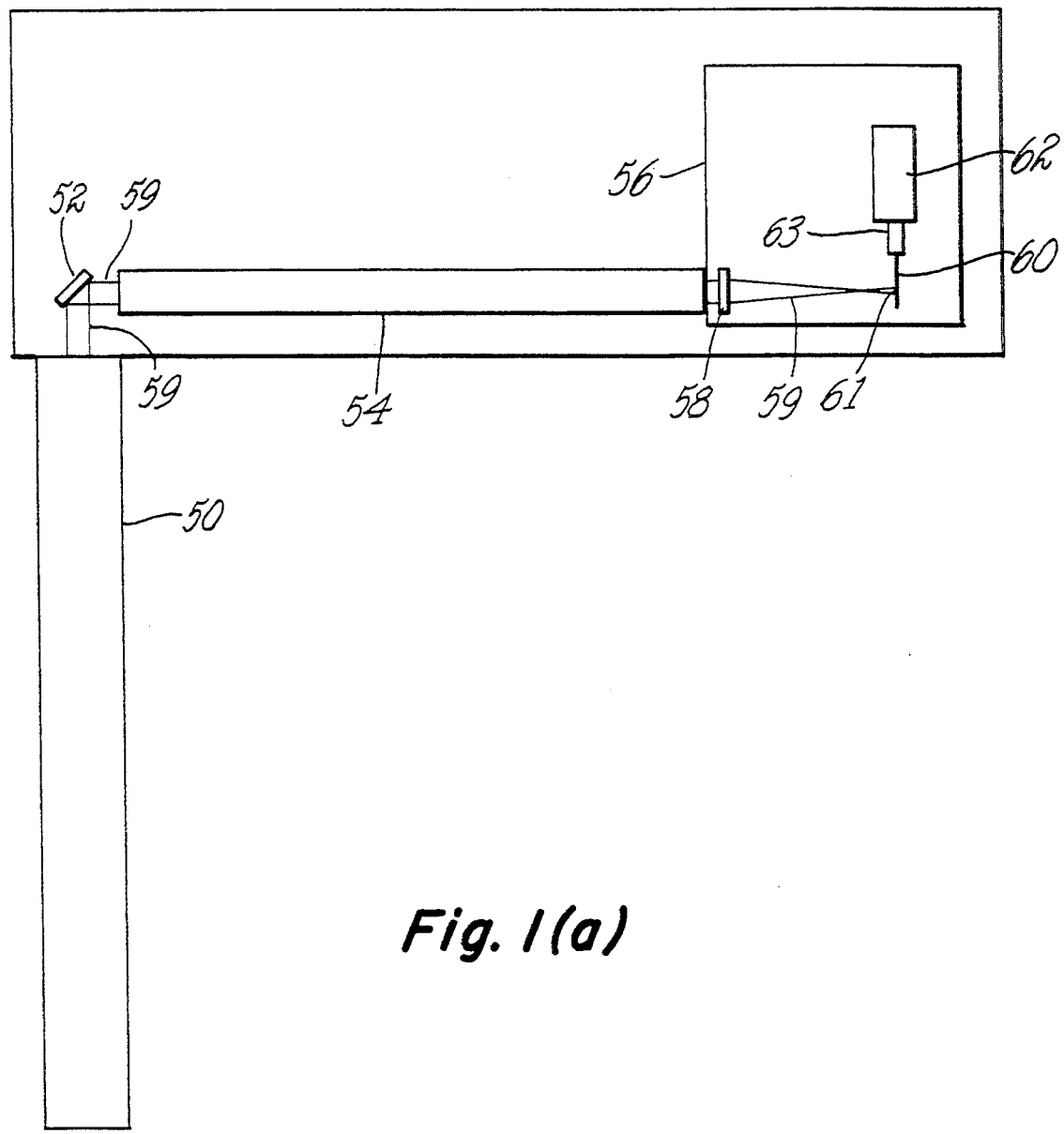
FIG. 1(a) schematically illustrates a laser apparatus employed to convert PCA to sapphire according to the practice of the invention while FIG. 1(b) schematically illustrate a detail of reducing the size and focusing of the laser beam on the PCA tube and FIG. 1(c) schematically illustrates the position of the optical pyrometer during the conversion process.
Figure 1B:
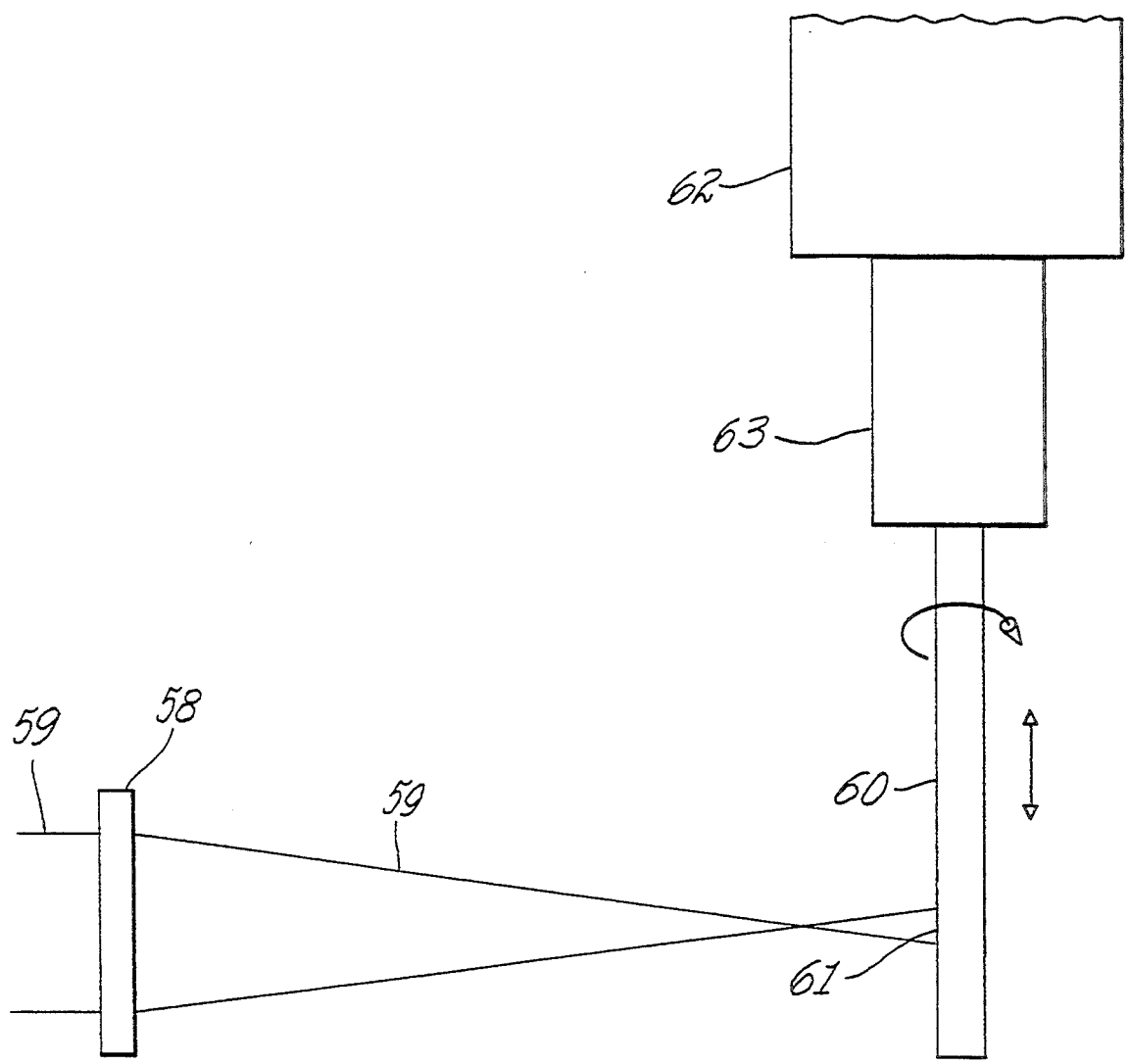
Figure 1C:
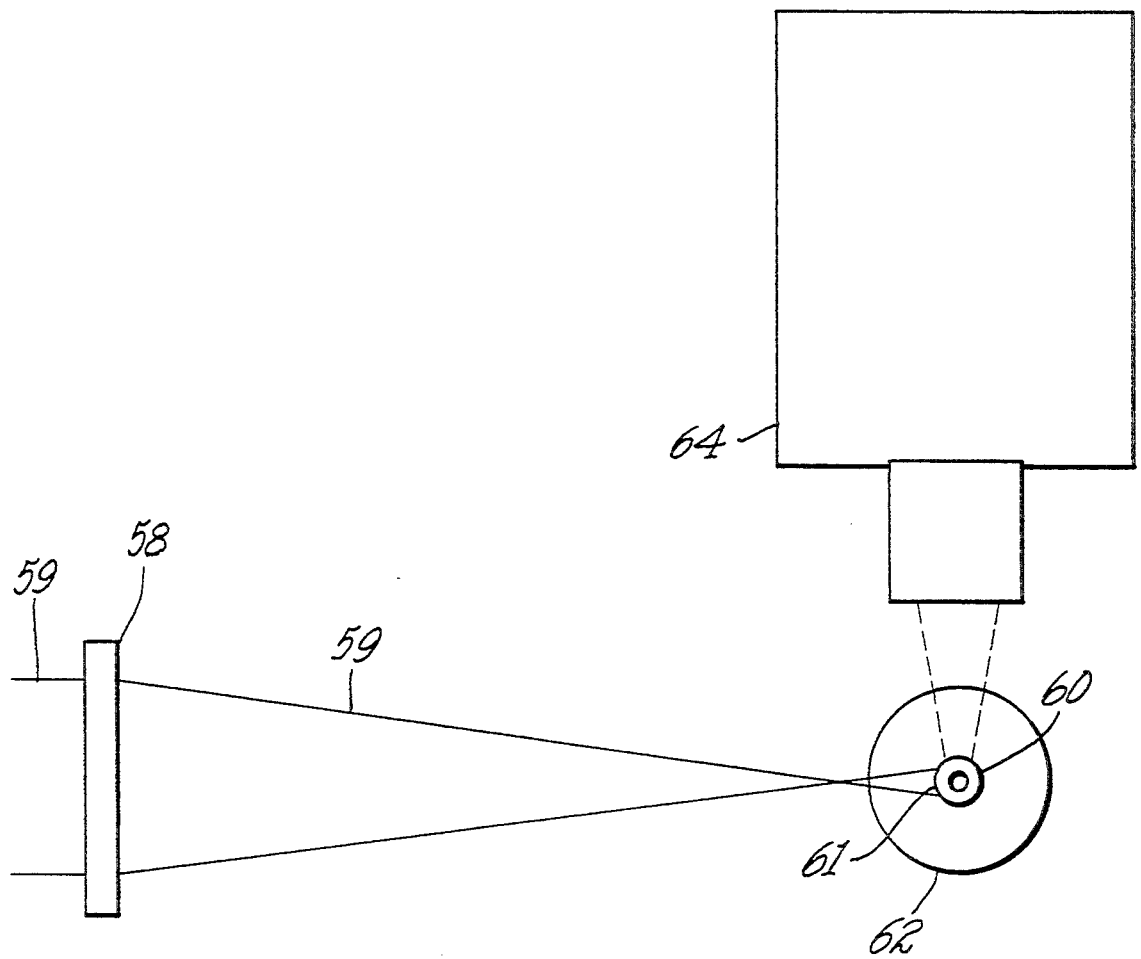

Turning to FIG. 1(a) there is schematically disclosed an apparatus employed in carrying out the practice of the process of the invention comprising a laser 50 emitting beam 59 which is reflected by a mirror 52 and redirected through a tube enclosure 54 and a window means not shown (i.e., germanium) into a transparent, Plexiglas ® (a plastic material made from methyl methacrylate) chamber 56 having an atmosphere comprising mostly argon with some air, and through a focusing lens 58 which reduced the beam size and directed the reduced laser beam on one end of a hollow PCA tube 60 at location 61. PCA tube 60 was 100 mm long with a 5.5 mm OD and a wall thickness of about 0.5 mm. Laser beam 54 was from a 150 watt continuous wave carbon dioxide ($CO_2$) laser and was used as the localized energy or heating source for the process in this embodiment. The diameter of the beam exiting the laser was 12 mm and in one case was focused down to a 1 mm diameter at 61 by means of focusing lens 58. In another experiment a cylindrical focusing lens was used to focus the laser beam to a rectangle approximately ¼ mm wide and 2–3 mm long with the long dimension parallel to the longitudinal axis of tube 60. In both of these experiments the laser beam was perpendicular to the longitudinal axis of the PCA tube 60 as is illustrated in FIG. 1. Focusing the laser beam down to a 1 mm diameter circle or to a rectangle provided a point and a line heating source, respectively. In yet another experiment in which the laser beam was focused down to a 1 mm diameter, the laser beam was applied to the tube at an angle other than the 90° shown in FIG. 1 to provide an oval-shaped heating source. In all the experiments, the hollow PCA tube 60 was rotated about its longitudinal axis at a speed of about 200 RPM by motor means 62 in which PCA tube 60 was held by chuck means 63. Location 61 was approximately 10 mm from the free end of the tube. Focusing the laser beam down to a diameter of 1 mm or to a rectangle provided either a point or a line heating source and the rotation of the tubing about its longitudinal axis was done to achieve circumferential heating which resulted in an effective "ring" heating source around the tubular structure. Instead of rotating the tube, the laser beam could have been divided and focused at several points around the circumference as is disclosed in U.S. Pat. No. 3,944,640; more than one laser beam could have been employed, or the laser beam could have been reflected off a conically-configured reflector in an elliptical cavity to provide a ring-shaped localized heating source as is disclosed in U.S. Pat. No. 4,058,699. These and other possible methods for achieving "ring" heating of the tube are known by those skilled in the art. The surface temperature of the PCA tubing was checked at various times and at various points along its longitudinal axis by means of an 8 micron Ircon Optical Pyrometer 64 illustrated in FIG. 1(c) located above the PCA tube 60 and motor means 62. The laser power was slowly increased over a period of 45 minutes in order to heat the PCA tubing up slowly to avoid cracking of the tubing due to thermal shock which would otherwise occur if the heating rate was too fast. The final maximum wattage employed with the laser was 120 watts which raised the outer surface temperature of the tube in a ring-shaped pattern at 61 to a temperature above about 1800° C. The maximum temperature which the optical pyrometer was able to measure with any degree of accuracy was 1800° C. The laser beam was kept on at the 120 watt power level at point 61 with the tube rotating during the conversion of the entire PCA tube to sapphire or single crystal alumina. In one experiment evidence of surface melting was observed where the laser beam was focused on the PCA tube, which meant that the surface temperature was at least 2050° C. which is the melting point of sapphire. However, this high temperature was believed to be limited to the surface and probably did not extend across the wall thickness of the tube, because the tube did not slump or bend during the experiment. In other experiments there was no visibly discernible evidence of surface melting. In both cases, with or without surface melting, the entire 100 mm long PCA tube converted to sapphire, even though the laser beam was directed only at a small point at one end of the tube. In one experiment, while the laser beam was on and focused at the free end of the PCA tube, the tube was slowly translated 1 mm longitudinally along its longitudinal axis to further minimize the chance of thermally shocking the tube at the point 61 where the laser beam was focused. The PCA tubing was successfully converted to sapphire in all these experiments, both with and without the very small lateral translation and with and without the localized surface melting. After maintaining the heated ring portion of tubing 60 at a temperature above 1800° C. as measured by the pyrometer for between one-half to one hour, the laser power was slowly reduced down to the zero power level over a period of about 45 minutes and the tube was allowed to cool to room temperature. The entire process cycle time took anywhere from between 2 to 3 hours.

The conversion of the PCA to sapphire occurs by a solid state process. Temperature data measured by the optical pyrometer and taken along the length of the PCA tube during the conversion procedure are listed in the table below. Conversion of the PCA to sapphire occurred out to over 100 mm away from the laser focal point on the tube. The data shown in the table indicates that conversion of PCA to sapphire occurred at bulk tube temperatures significantly lower than 2050° C., the melting point of alumina. Temperature readings are approximate as no calibration standards specific to a sapphire system were available, but readings are believed to be accurate to ±100°.

| Temperature Measurement by Optical Pyrometry Along PCA Tube | |
| --- | --- |
| Distance (in mm) from laser focal point on PCA tube | Approximate Temperature (°C.) |
| 0 | 1800–2050* |
| 5 | 1300 |
| 10 | 800 |

| Temperature Measurement by Optical Pyrometry Along PCA Tube | |
|---|---|
| Distance (in mm) from laser focal point on PCA tube | Approximate Temperature (°C.) |
| >13** | <600 |

*Pyrometer limit is 1800° C., alumina melting point is 2050° C.; sample was above 1800° C. but was not melted.
**Total sample tube length converted to sapphire is 100 mm.

Figure 2:
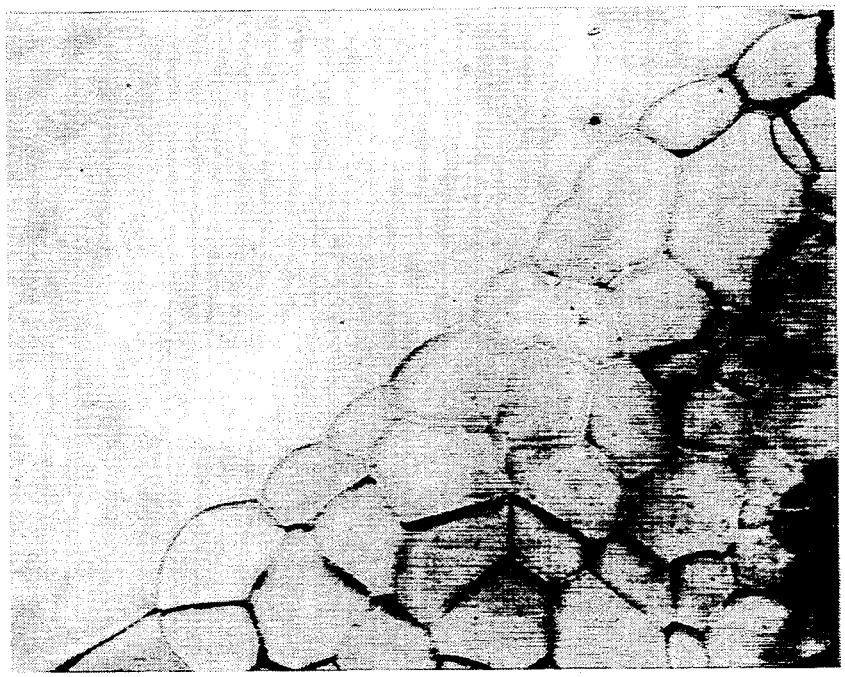
FIG. 2 is an optical micrograph at 200× magnification illustrating the surface texture of sapphire produced according to the process of the invention.

Characterization of the sapphire material produced according to this invention was done using optical microscopy, scanning electron microscopy (SEM), four circle diffractometry, back reflection Laue and Precession Method X-ray techniques. SEM analysis showed the sapphire tubing produced by the process of the invention exhibited a topographical structure in the form of slight undulations, as shown in FIG. 2, having high points at approximately the midpoint of where each PCA grain was present prior to the conversion process and slight depressed areas corresponding to former grain boundaries of the PCA tube. The lattice parameters of the crystal unit cell for the material produced by the process of the invention were determined using four circle diffractometry. The lattice parameters were found to be $a=4.759$Å and $c=12.991$Å which are in agreement with the published data of Lee and Lagerlof, J. Electron Microscopy Technique, 2:247–258, (1985) for single crystal alpha alumina (sapphire). Back reflection Laue and Precession Method X-ray techniques were used to confirm that the material produced by the process of the invention was a single crystal. Both techniques confirmed that a constant orientation was maintained down the length of the material.

FIG. 2 is a photograph, taken at a magnification of 200× through an optical microscope, of a section of a PCA tube which illustrates the boundary between the grains or crystallites and the sapphire formed during the process of the invention. The lighter area is the sapphire in which it is possible to see slight low points located where the grain boundaries were before the PCA converted to sapphire. As described above, the surface of the sapphire portion has a texture which exhibits itself as a topographical structure in the form of slight undulations having high points at approximately the midpoint of where each PCA grain was prior to the conversion and slight depressed areas corresponding to where the grain boundaries were prior to conversion.

A starting material which has been found useful in the practice of the embodiment of the invention wherein a PCA body is converted to sapphire is a PCA body of relatively pure alpha alumina free of microcracks, because microcracks will prevent the sapphire crystal front from propagating and thereby prevent conversion of the PCA to sapphire. In general this means that the PCA body will have an average crystallite or grain size below 100 microns, preferably no greater than 70 microns and still more preferably no greater than 50 microns. The density will be greater than 3.90 g/cc, and more typically greater than 3.97 g/cc. The density of the Lucalox brand PCA used in the experiments is at least 3.97 g/cc and more typically about 3.98 g/cc. The PCA body will preferably have a relatively uniform grain size with an average grain size ranging between about 15–70 microns and more preferably between about 20–50 microns. By grain size is meant the average dimension of a grain as measured by the well-known linear intercept technique described in ASTM E112-88. The PCA should be greater than 99 wt. % alpha alumina and free of impurities of a type and in an amount that would prevent conversion of the PCA body to sapphire. One example is magnesia in an amount of as little as 100 wppm which will prevent the PCA from converting to sapphire. Thus, magnesia if present should be less than 100 wppm, preferably below 70 wppm and still more preferably below 50 wppm. By "below 50 wppm" is meant to include PCA with no magnesia or PCA with a magnesia content from 0–50 wppm. The PCA starting material can be prepared from alumina powder and suitable dopants using the processes known and described in the U.S. Pat. Nos. 3,026,210; 4,150,317 and 4,285,732 referred to earlier or it can be any commercially available PCA material meeting the requirements of purity, density, grain size, etc., referred to above, such as the General Electric Company brand of Lucalox ® PCA available from the General Electric Company in Cleveland, Ohio.

The General Electric Company Lucalox brand of PCA has an equiaxed grain structure and a relatively uniform grain size with the average crystallite or grain size generally ranging between 20–35 microns. For an average grain size of approximately 26 microns diameter the majority (i.e., >50%) of the grains range from about 20 microns diameter to about 30 microns diameter, with no grains being larger than 100 microns and with few, if any (i.e., <1%) being over 70 microns. Magnesium oxide or magnesia (MgO) is present in an amount of about 300–400 wppm and the Lucalox has a melting point of about 2050° C. A typical chemical analysis for Lucalox PCA which is 99.9% alumina is set forth below:

| Trace Element | Si | Fe | Ca | Mg | K | Na | Li | Mo | Cr | Cu |
|---|---|---|---|---|---|---|---|---|---|---|
| PPM Detected | 50 | 4 | 7 | 180 | 50 | 80 | <1 | 10 | 2 | 4 |

The 180 wppm of magnesium is equivalent to 325 wppm of magnesia which is a typical level of magnesia present in this material. The (sintered) density of Lucalox PCA is typically at least 3.97 g/cm³ and generally approximately 3.98 g/cm³ and it has a translucent white appearance. Since the amount of magnesium oxide present in Lucalox PCA is too great to permit its conversion to sapphire in the process of this invention, the amount of magnesium oxide present in it must be reduced to a level below 100 wppm, preferably below 70 wppm and still more preferably below 50 wppm in order to be able to convert the Lucalox PCA to sapphire in the process of this invention.

Those skilled in the art know that the magnesium oxide can be driven out by heating the PCA body in a hydrogen-containing atmosphere, vacuum, or inert gas to a temperature between about 1700°–1980° C. Heating the PCA body to these temperature regimes to reduce the magnesium oxide content, followed by cooling down to room temperature, is done slowly to avoid thermal shock and concomitant cracking of the PCA body. This has been accomplished in a facile manner in a high temperature electric resistance furnace by slowly heating the PCA body up to a temperature of about 1880° C. in dry hydrogen, holding at 1880° C. and then slowly cooling down to room temperature. Hydrogen having a dew point below 0° C. is preferred. The drier the hydrogen the less time is required to remove the magnesia. Other times, temperatures and atmospheres can be used to reduce the magnesia content as is known to those skilled in the art. Thicker samples will, of course, require more time. With General Electric Company Lucalox brand of hollow PCA tubing having a 5.5 mm OD and a ½ mm wall thickness, about 9–12 hours at 1880° C. were required to reduce the magnesia content to a level below 50 wppm. The magnesia level was determined in all cases by using the Inductively Coupled Plasma (ICP) analysis. The lowest limit of magnesia measurable by this method is 10 wppm.

Any available PCA material having the characteristics set forth above may be employed in practicing the process of the invention, including PCA fabricated without having magnesia present. Alternately, the practitioner may if desired, fabricate his own PCA material starting with a suitable grade of relatively pure particulate alumina being primarily alpha alumina, such as Baikowski CR-10, using the techniques in the patents referred to above or other techniques known by those skilled in the art that will produce a dense alumina body or article having the material characteristics described above.

It is understood that various other modifications will be apparent to and can be readily made by those skilled in the art without departing from the scope and spirit of the invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains. For example, the localized energy source may be one or more lasers or it may be one or more heat lamps focused by means of suitable reflectors as disclosed, for example, in Japanese Patent Publication 61-28637. A plasma (torch), an RF heated susceptor in close proximity to a portion of the PCA article to be converted to sapphire, a direct or coupled microwave heating zone, or RF coupled heating zone or an electron or other high energy particle beam may be employed, as those skilled in the art will know and appreciate. Still another localized energy source will comprise a body of molten alumina or other suitable material in which case a portion of the PCA article which is to be converted to sapphire will be immersed in or contacted with the molten body to convert the entire article to sapphire. If the temperature of the molten body is at least 2050° C., this will cause at least partial melting of that portion of the article in contact with the molten body which is within the scope of the invention and which is explained in greater detail below.

Finally, as set forth above, the process of this invention includes the embodiment wherein there is no visibly discernible melting of any portion of the PCA article being converted as well as the embodiment where surface melting or bulk melting of a portion of the PCA article occurs during the conversion to sapphire. Those skilled in the art will appreciate that in some cases one can fabricate a PCA article having a sacrificial portion which is not necessary or undesired in the final sapphire article. In such cases it may be advantageous to cause melting, surface or bulk, of all or a portion of the sacrificial portion of the PCA article during conversion to sapphire and then remove the sacrificial portion leaving the desired sapphire article or body.

What is claimed is:

1. A solid state process for bulk conversion of a polycrystalline alumina body to sapphire which comprises initiating crystal growth by heating only a portion of the polycrystalline alumina body to a temperature of about 1800° C. with a localized energy source such that conversion of the polycrystalline alumina body to sapphire is initiated and propagates to the remaining polycrystalline alumina which remains at temperatures below 1800° C.

2. A process according to claim 1 wherein said localized energy source comprises a laser.

3. A process according to claim 1 wherein no portion of said polycrystalline alumina body is melted during said conversion to said sapphire.

4. A process according to claim 3 wherein said localized energy source comprises a laser.

5. A process according to claim 1 wherein a portion of the surface of said polycrystalline alumina body is melted during said conversion.

6. A process according to claim 5 wherein said localized energy source comprises a laser.

7. A process according to claim 1 wherein a portion of said polycrystalline alumina body is melted in bulk during said conversion.

8. A process according to claim 7 wherein said localized energy source comprises a laser.

9. A solid state process for bulk conversion of a polycrystalline alumina body to sapphire wherein said polycrystalline alumina body has a magnesia content below 100 wppm and a density of at least 3.97 g/cc, said process comprising heating only a portion of said polycrystalline alumina body with a localized energy source to a temperature of at least 1800° C. without melting any portion of said polycrystalline alumina body, said heating being maintained for a time sufficient to convert said polycrystalline alumina body to sapphire.

10. A process according to claim 9 wherein said magnesia level is below 70 wppm.

11. A process according to claim 10 wherein said magnesia level is below 50 wppm.

12. A process according to claim 11 wherein said polycrystalline alumina body contains no magnesia.

13. A process according to claim 12 wherein said localized heating source comprises a laser.

14. A process according to claim 13 wherein said melted portion is restricted to the surface of said polycrystalline alumina body.

15. A process according to claim 14 wherein said polycrystalline alumina body has an average grain size below 70 microns and a magnesia content below 50 wppm.

16. A process according to claim 15 wherein said localized heating source comprises a laser.

17. A process according to claim 11 wherein said polycrystalline alumina body has an average grain size below 100 microns.

18. A process according to claim 17 wherein said polycrystalline alumina body has an equiaxed grain structure.

19. A process according to claim 9 wherein said localized heating source comprises a laser.

20. A solid state process for bulk conversion of a polycrystalline alumina body to a sapphire body wherein said polycrystalline alumina body has a magnesia content below 100 wppm and a density greater than 3.97 g/cm$^3$, said process comprising heating only a portion of said polycrystalline alumina body with a localized energy source to melt a portion of said body and maintaining said heating for a time sufficient to convert said polycrystalline alumina body to said sapphire body.

21. A process according to claim 20 wherein said melted portion is melted in bulk during said conversion.

22. A process according to claim 21 wherein said polycrystalline alumina body has an average grain size below 100 microns and a magnesia content below 100 wppm.

23. A process according to claim 22 wherein said localized heating source comprises a laser.

24. A solid state process for converting a polycrystalline alumina body to sapphire having a completely random pore structure and a surface texture which exhibits itself as a topographical structure in the form of slight undulations having high points at approximately the midpoint of where each polycrystalline alumina grain was prior to conversion of said polycrystalline alumina body to said sapphire and slight depressed areas corresponding to where grain boundaries were prior to said conversion, said polycrystalline alumina body having an average grain size below 100 microns, a density of at least 3.97 g/cc, a magnesia content in the range of 0-50 wppm and free of microcracks which would prevent said conversion, wherein said process comprises heating only a portion of said body with a localized energy source at a temperature and for a time sufficient to convert said polycrystalline alumina body to said sapphire.

* * * * *